United States Patent [19]

Hall, II

[11] 3,909,633

[45] Sept. 30, 1975

[54] WIDE BANDWIDTH SOLID STATE INPUT BUFFER

[75] Inventor: David Wilson Hall, II, Paradise Valley, Ariz.

[73] Assignee: Motorola, Inc., Chicago, Ill.

[22] Filed: Dec. 5, 1974

[21] Appl. No.: 529,781

Related U.S. Application Data

[63] Continuation of Ser. No. 342,667, March 19, 1973, abandoned.

[52] U.S. Cl. ................ 307/268; 307/205; 307/214; 307/263; 307/279; 307/304

[51] Int. Cl.² ..................... H03K 5/01; H03K 19/08

[58] Field of Search ........... 307/205, 214, 268, 263, 307/279, 304, DIG. 1

[56] References Cited

UNITED STATES PATENTS

| | | | |
|---|---|---|---|
| 3,283,259 | 11/1966 | Banks | 307/268 |
| 3,376,434 | 4/1968 | Weinstock | 307/268 |
| 3,612,908 | 10/1971 | Heimbigner | 307/279 |
| 3,631,528 | 12/1971 | Green | 307/237 |
| 3,657,568 | 4/1972 | Dargent | 307/268 |
| 3,675,043 | 7/1972 | Bell | 307/214 |
| 3,739,193 | 6/1973 | Pryor | 307/205 |
| 3,745,371 | 7/1973 | Suzuki | 307/221 C |
| 3,766,408 | 10/1973 | Suzuki et al. | 307/279 |
| 3,772,535 | 11/1973 | Tuten | 307/279 |

*Primary Examiner*—Stanley D. Miller, Jr.
*Attorney, Agent, or Firm*—Vincent J. Rauner; Kenneth R. Stevens

[57] ABSTRACT

An input buffer circuit provides a series of output electronic pulses, substantially identical to each other and having relatively fast rise and fall times, even though the input pulses to the buffer may be unlike each other and have relatively slow rise and fall times. A first inverter receives and inverts the input pulses while a second inverter provides the uniform output pulses. A first latching circuit, comprised of a third and fourth inverter first opposes and then changes state to aid the inversion of a pulse by the first inverter resulting in a net speed-up of inversion. A second latching circuit first opposes and then changes state to aid the inversion, in the opposite direction, of a pulse by the first inverter resulting in a net speed-up of inversion in the opposite direction. The two latching circuits thereby provide an inverted pulse to the second inverter that has fast fall and rise time. This inverted pulse is nearly independent of the input pulse, except as to the triggering function of the first inverter, therefore, the pulses out of the second inverter are substantially identical.

11 Claims, 3 Drawing Figures

WIDE BANDWIDTH SOLID STATE INPUT BUFFER

This is a continuation of application Ser. No. 342,667, filed Mar. 19, 1973, now abandoned.

BACKGROUND OF THE INVENTION

This invention relates to buffers for receiving electronic signals, shaping those signals and sending them on to other electronic circuits. More specifically, this invention relates to buffers for receiving an input signal of a first level designated a binary "1" or of a second level designated a binary "0". These levels come in the form of pulses which are shaped and sent to electronic equipment commonly used in digital operations.

A common practice in the prior art to obtain uniform output pulses from a buffer is to connect a number of inverters in series between the input inverter and the output inverter. The number of inverters required in this prior art method is determined empirically. That is, inverters may be cascaded until the desired pulse at an acceptable delay time is achieved. The main disadvantage of this prior art configuration is the total delay resulting from the individual delays through the inverters. Another disadvantage is the amount of circuitry that must be used. The instant invention overcomes both of these problems.

BRIEF SUMMARY OF THE INVENTION

A first inverter is adapted to receive and invert an input electronic signal having a first voltage level designated a binary 1 and a second voltage level designated a binary 0. A second inverter is adapted to provide an output signal in response to the input signal, but shaped to have a specified rise time and a specified fall time irrespective of the rise and fall times of the input signal.

A first and a second latching circuit are connected between the first and second inverters. The first latching circuit is comprised of a third and fourth inverter with the input of the third inverter and the output of the fourth inverter tied to a node between the output of the first inverter and the input of the second inverter. The fourth inverter opposes the inversion from a 1 to a 0 of the first inverter. However, the inversion continues, albeit delayed, until the threshold voltage of inverter three is reached. The threshold voltage is the point at which an inverter begins to change state in response to an input signal having reached the threshold voltage. In the case of the third inverter, the threshold voltage is of an amplitude between the first voltage level and the threshold voltage of the second inverter.

The second latching circuit is comprised of a fifth and sixth inverter wherein the input to the fifth inverter and the output of the sixth inverter are tied together to the node between the output of the first inverter and the input of the second inverter. The output of the fifth inverter is tied to the input of the sixth inverter. The sixth inverter opposes the inversion of the first inverter from a 0 to a 1, but the inversion continues until the threshold voltage of inverter five is reached. The threshold voltage of inverter five is between the threshold voltage of inverter two and the second voltage level. When the threshold voltage of inverter five is reached, the second latching circuit causes inverter two to switch rapidly, thus providing an acceptably fast fall time of the output pulse. The first and second latching circuits effectively shape the inverted pulse from the first inverter to provide the second inverter with an input pulse having fast fall and rise times. The second inverter, in inverting its input pulse, provides a buffer output pulse which is still better shaped, with uniform rise and fall times.

Furthermore, by careful selection of inverters as to their physical sizes and thresholds, an excellent noise immunity can be had.

It is an object of this invention to provide an extremely wide band solid state input buffer for receiving bi-level input signals having relatively slow rise and fall times and for providing output signals substantially identical to each other, having relatively fast rise and fall times.

Another object of this invention is to provide a solid state buffer for receiving a bi-level input pulse and for providing a uniform output pulse having fast rise and fall times, in response to the input pulse with a very small delay therebetween.

Still another object of this invention is to provide an input buffer having a first latching circuit which effectively shortens the time of transition from a 1 to a 0 from an input inverter and a second latching circuit which effectively increases the speed of transition from a 0 to a 1.

These and other objects are obvious in the detailed description that follows.

DETAILED DESCRIPTION OF THE INVENTION

Figure 1:
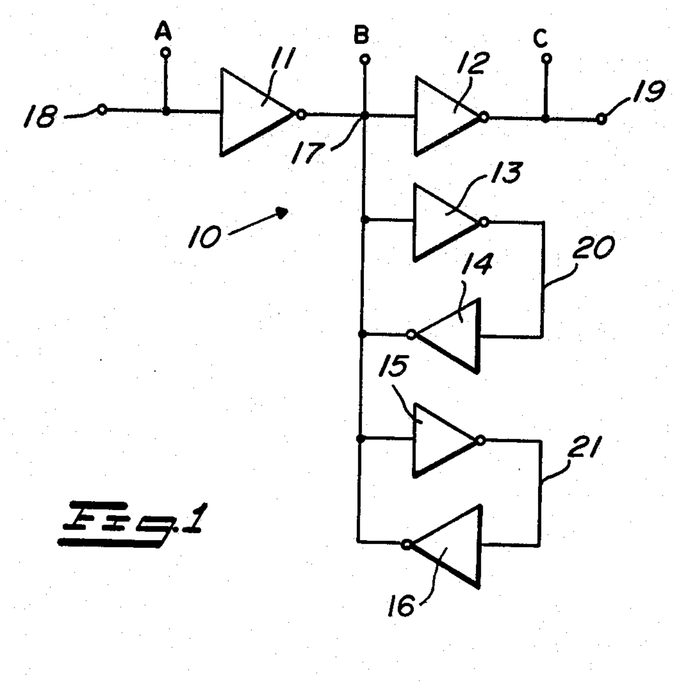
FIG. 1 is a block diagram showing the inverters used in this invention.

Referring first to FIG. 1, input inverter 11 is shown having its output connected to node 17 which is connected to the input of output inverter 12. Input terminal 18 is connected to the input of inverter 11 and is adapted to receive an incoming bi-level electronic pulse.

Inverters 13 and 14 form a first latching circuit 20 with the output of inverter 14 and the input of inverter 13 tied together and to node 17. The output of inverter 13 serves as the input to inverter 14.

Inverters 15 and 16 form a second latching circuit 21 with the output of inverter 16 tied to the input of inverter 15 and then to node 17. The output of inverter 15 is tied to the input of inverter 16.

Therefore, the input to inverter 12 comes from inverter 11 and the first and second latching circuits. This particular combination of inputs provides an output pulse at terminal 19 which has a uniform and fast rise and fall time.

Figure 2:
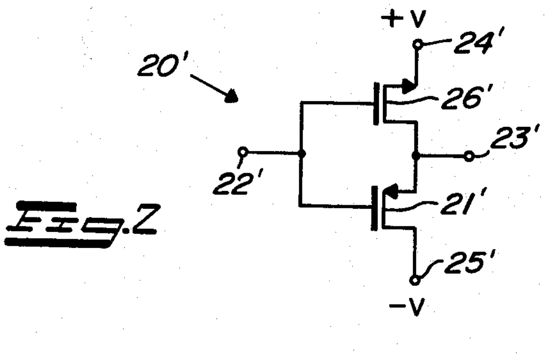
FIG. 2 is a schematic diagram showing an inverter of the preferred embodiment.

FIG. 2 illustrates schematically a typical complementary metal-oxide-silicon (CMOS) inverter circuit 20'. A P-channel MOS device 26' is shown with its source connected to a positive source of voltage at terminal 24' and its drain connected to output terminal 23'. N-channel MOS device 21' is shown with its source connected to a negative voltage source at terminal 25' and its drain connected to the drain of MOS device 26' and output terminal 23'. The gates of devices 21' and 26' are tied together to input terminal 22'.

This CMOS inverter represents the preferred embodiment of this invention but those with ordinary skill in the art realize that bi-polar transistors, field effect transistors and insulated-gate field effect transistors of the single channel type are readily combinable to form inverters which could also be used in this particular application.

MODE OF OPERATION OF THE INVENTION

Figure 3:
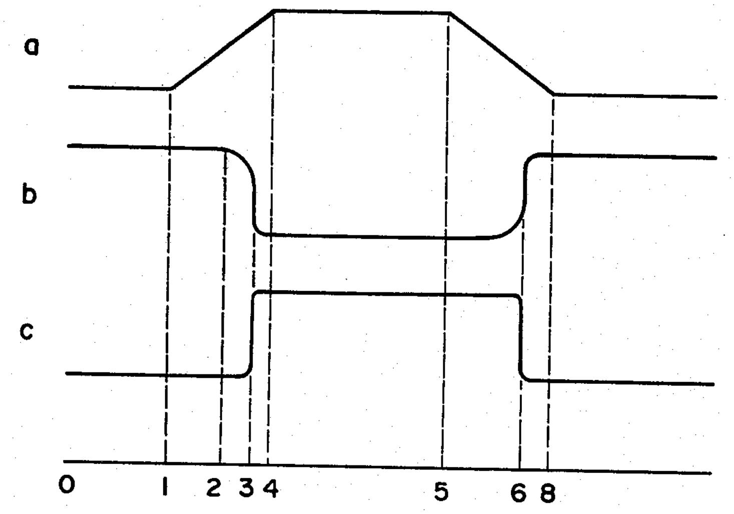
FIG. 3 illustrates the signals present at points "A", "B" and "C" of FIG. 1.

FIG. 1 illustrates test points A, B and C. FIG. 3 illustrates idealistic pulses that may be seen at those points. The Y coordinate of FIG. 3 represents voltage amplitude while the X coordinate represents time.

Pulse A illustrates an incoming pulse having a rise time as shown between time 1 and time 4 and a fall time as shown between time 5 and time 8. These times, for purposes of illustration, are not acceptable to the system which the input buffer feeds. If latching circuits 20 and 21 were disconnected, the pulse A would be inverted through inverter 11 and inverted again through inverter 12 with the output pulse at point C having somewhat faster rise and fall times but by no means acceptable ones.

The physical dimensions of inverter 11 are substantially greater than those of inverters 14 and 16 so that inverter 11 is able to overcome the opposition presented by inverters 14 and 16.

To understand the operation, assume that pulse A is slowly rising as shown from times 1 to 4. Inverter 11 begins to invert from a binary 1 to a binary 0 as shown at B, but inverter 14 of latching circuit 20 and inverter 16 of latching circuit 21 are both in the binary 1 state and oppose the inversion. However, inverter 11, being of a larger size, is able to slowly invert against the opposition until the threshold voltage of inverter 13 is reached. The threshold voltage of inverter 13, which is the point at which inverter 13 changes state, is at a predetermined value which is closer to +V as shown in FIG. 2 than is the threshold voltage of inverter 12. The threshold voltage of inverter 15 is a predetermined value closer to −V of FIG. 2 than the threshold voltage of inverter 12. When inverter 13 changes state, it provides a 1 input to inverter 14 which also changes state and thereby aids the inversion of the input pulse by inverter 11 causing an immediate drop as shown at time 2 of point B. This drop also causes a change of state of inverters 15 and 16 of latching circuit 21 to further aid in the inversion. This combination of events produces an output pulse shown at point C having an acceptable rise time as indicated at time 3. It should be noted that the input pulse A completes its rise at time 4, long after the output pulse at C reaches its maximum.

Reference should now be made to times 5 through 8 of FIG. 3 representing the fall time of input pulse A. Inverter 11 attempts to invert from a binary 0 state to a binary 1 state but is again opposed by inverters 14 and 16. Nevertheless, the inversion continues until the threshold voltage of inverter 15 is reached. Inverter 15 changes state causing inverter 16 to also change state producing a 1 output. The inversion from 0 to 1 is therefore aided, causing a sudden change as shown at time 6, pulse B. The sudden rise in voltage causes a change in state of inverters 13 and 14 of latching circuit 20 which further aids in the rapid transition. The combination of events results in an output waveform at point C having an acceptable fall time.

An important feature of this input buffer is its immunity to noise. The degree of immunity depends largely upon the physical size of inverter 11 with respect to inverters 14 and 16. For example, if inverter 11 were too small, then inverters 14 and 16 would never permit an inversion by inverter 11. Under those circumstances, there would be 100 percent noise immunity but of course, there would also be 100 percent signal immunity and no operation. By the proper size relationship and threshold points, this invention has yielded an immunity of 70 percent of the positive voltage (assuming the negative voltage = 0. The predetermined thresholds and physical sizes of the preferred embodiment are as follows:

| Inverter No. | N Channel W (Mils) | N Channel L (Mils) | P Channel W (Mils) | P Channel L (Mils) | Threshold % of V+ |
|---|---|---|---|---|---|
| 11 | 3.0 | 0.4 | 3.0 | 0.4 | 50 |
| 12 | 10.0 | 0.4 | 10.0 | 0.4 | 50 |
| 13 | 1.6 | 0.4 | 1.0 | 0.4 | 60 |
| 14 | 0.6 | 0.4 | 0.6 | 0.4 | 50 |
| 15 | 1.0 | 0.4 | 1.6 | 0.4 | 40 |
| 16 | 0.6 | 0.4 | 0.6 | 0.4 | 50 |

The above parameters are, of course, not intended to limit the invention to the use of CMOS devices with the particular parameters given. Those of ordinary skill in the art, as mentioned above, may use other semiconductive devices and if CMOS devices are used, the particular parameters may well be varied, depending upon the results wanted.

What is claimed is:

1. A signal shaping circuit comprising:

a. a common node;

b. input means adapted to receive an input signal, said input means being responsive to the input signal changing states at first or second transition times to either a first or a second digital level for applying either first or second transition voltage signals, respectively, to said first common node;

c. first and second threshold switching device means coupled to said first common node, said first and second threshold switching device means each being responsive to first or second voltage levels, respectively, for changing states;

d. third output threshold switching device means coupled to said first common node and being responsive to a third voltage level for changing states, said third voltage level being intermediate to said first and second voltage levels;

e. said first threshold switching device means being responsive during a first portion of said first transition voltage signal for supplying current in one direction for opposing said first transition voltage signal in going from said first to said second digital level, and being responsive during a second portion of said first transition voltage signal for sinking current in an opposite direction for assisting said first transition voltage signal in going from said first to said second digital level.

2. A signal shaping circuit as in claim 1 wherein:

a. said second threshold switching device means being responsive during a first portion of said second transition voltage signal for supplying current in one direction for opposing said second transition voltage signal in going from said second to said first digital level and, being responsive during a second portion of said second transition voltage signal for sinking current in an opposite direction for assisting said second transition voltage signal in going from said second to said first digital level.

3. A signal shaping circuit as in claim 2 wherein:

a. said input means includes impedance means having a value for insuring that said first, second and third output threshold switching device means switch states at their respective first, second, and third voltage levels.

4. A signal shaping circuit as in claim 3 wherein:

a. said first threshold switching device means comprises a first closed loop including first MOS and second MOS serially interconnected inverter circuits;

b. saie second threshold switching device means comprise a second closed loop including third MOS and fourth MOS serially interconnected inverter circuits; and c. said first and second threshold switching device means being connected in parallel to said first common node.

5. A signal shaping circuit as in claim 4 wherein:

a. said first and third inverter MOS circuits each constitute voltage threshold switching devices responsive to said first and second voltage levels, respectively.

6. A signal shaping circuit as in claim 4 wherein:

a. said second and fourth MOS inverter circuits constitute first and second reversible current generators, respectively.

7. A signal shaping circuit as in claim 3 wherein:

a. said first and second threshold switching device means and said third output threshold switching device means each comprise CMOS devices.

8. A signal shaping circuit as in claim 3 wherein:

a. said first and second threshold switching device means each comprise CMOS devices.

9. A signal shaping circuit as in claim 7 wherein:

a. said input means comprises a CMOS device.

10. A signal shaping circuit as in claim 4 wherein:

a. said input means and said third output threshold switching device means each comprises a MOS fifth and a MOS sixth inverter circuit, respectively.

11. A signal shaping circuit as in claim 4 wherein:

a. said first, second, third and fourth inverter circuits each comprise CMOS devices.

* * * * *